United States Patent
Song et al.

(10) Patent No.: US 9,741,973 B2
(45) Date of Patent: Aug. 22, 2017

(54) DISPLAY DEVICE AND METHOD FOR MANUFACTURING THE SAME

(71) Applicant: SAMSUNG DISPLAY CO., LTD., Yongin, Gyeonggi-Do (KR)

(72) Inventors: Young Rok Song, Yongin-si (KR); Seon Ju Kim, Seoul (KR); Beohm Rock Choi, Seoul (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 2 days.

(21) Appl. No.: 14/697,275

(22) Filed: Apr. 27, 2015

(65) Prior Publication Data
US 2016/0233282 A1   Aug. 11, 2016

(30) Foreign Application Priority Data

Feb. 6, 2015 (KR) .................. 10-2015-0018345

(51) Int. Cl.
| | | |
|---|---|---|
| *H01L 51/50* | (2006.01) | |
| *H01L 51/56* | (2006.01) | |
| *H01L 27/32* | (2006.01) | |
| *H01L 51/52* | (2006.01) | |

(52) U.S. Cl.
CPC .......... *H01L 51/56* (2013.01); *H01L 27/3244* (2013.01); *H01L 51/5228* (2013.01); *H01L 51/5206* (2013.01); *H01L 51/5221* (2013.01); *H01L 2227/323* (2013.01); *H01L 2251/5323* (2013.01)

(58) Field of Classification Search
None
See application file for complete search history.

(56) References Cited

U.S. PATENT DOCUMENTS

| | | | | |
|---|---|---|---|---|
| 7,608,992 B2* | 10/2009 | Kobayashi | .......... | H01L 27/3267 |
| | | | | 178/20.01 |
| 9,041,280 B2* | 5/2015 | Yan | .......... | H05B 33/22 |
| | | | | 313/504 |
| 2005/0264184 A1* | 12/2005 | Park | .......... | H01L 27/3267 |
| | | | | 313/504 |
| 2006/0038752 A1* | 2/2006 | Winters | .......... | G09G 3/3225 |
| | | | | 345/76 |

(Continued)

FOREIGN PATENT DOCUMENTS

| KR | 10-0685844 B1 | 2/2007 |
|---|---|---|
| KR | 10-2007-0068229 A | 6/2007 |

(Continued)

*Primary Examiner* — Benjamin Sandvik
(74) *Attorney, Agent, or Firm* — Lee & Morse, P.C.

(57) ABSTRACT

A display device and a method for manufacturing the same, the display device including a substrate that includes a first area and a second area; a first pixel electrode on the first area of the substrate; a first organic layer on the first pixel electrode, the organic layer including a first light emitting layer; a first counter electrode on the first organic layer; an auxiliary layer on the first counter electrode at the first area of the substrate; a second pixel electrode on the second area of the substrate; a second organic layer on the second pixel electrode, the second organic layer including a second light emitting layer; a second counter electrode on the second organic layer; and an upper reflective layer on the second counter electrode at the second area of the substrate.

21 Claims, 10 Drawing Sheets

(56) References Cited

U.S. PATENT DOCUMENTS

| | | | |
|---|---|---|---|
| 2007/0178224 A1* | 8/2007 | Fujii | H01L 27/3267 427/66 |
| 2012/0097928 A1* | 4/2012 | Kim | H01L 27/3267 257/40 |
| 2013/0187131 A1* | 7/2013 | Chung | H01L 27/326 257/40 |
| 2014/0145152 A1* | 5/2014 | Chung | H01L 27/3206 257/40 |
| 2015/0048335 A1* | 2/2015 | Chung | H01L 27/3267 257/40 |

FOREIGN PATENT DOCUMENTS

| | | |
|---|---|---|
| KR | 10-2011-0103735 A | 9/2011 |
| KR | 10-2011-0116255 A | 10/2011 |
| KR | 10-2012-0044876 A | 5/2012 |

* cited by examiner

DISPLAY DEVICE AND METHOD FOR MANUFACTURING THE SAME

CROSS-REFERENCE TO RELATED APPLICATION

Korean Patent Application No. 10-2015-0018345, filed on Feb. 6, 2015, in the Korean Intellectual Property Office, and entitled: "Display Device and Method for Manufacturing the Same," is incorporated by reference herein in its entirety.

BACKGROUND

1. Field

Embodiments relate to a display device and a method for manufacturing the same.

2. Description of the Related Art

In a display device, an organic light emitting display device (OLED) refers to a display device that can display information such as images and characters, using light generated by combining positive holes and electrons each provided from an anode electrode and a cathode electrode in an organic layer located between the anode electrode and the cathode electrode.

Such an organic light emitting display device may include a front emission type, a rear emission type, or a double-sided emission type, depending on a direction in which light is emitted from the organic layer, and the electrode material or the like of the organic light emitting display device may differ, depending on each emission type.

Here, the double-sided emission type organic light emitting display device is a device capable of simultaneously realizing the front emission and the rear emission on one display panel. It is possible to improve the brightness and to realize different images if desired, such a device has been noticed as a next-generation display device.

SUMMARY

Embodiments are directed to a display device and a method for manufacturing the same.

The embodiments may be realized by providing a display device, including a substrate that includes a first area and a second area; a first pixel electrode on the first area of the substrate; a first organic layer on the first pixel electrode, the organic layer including a first light emitting layer; a first counter electrode on the first organic layer; an auxiliary layer on the first counter electrode at the first area of the substrate; a second pixel electrode on the second area of the substrate; a second organic layer on the second pixel electrode, the second organic layer including a second light emitting layer; a second counter electrode on the second organic layer; and an upper reflective layer on the second counter electrode at the second area of the substrate.

An adhesive force between a material of the upper reflective layer and a material of the second counter electrode may be greater than an adhesive force between a material of the auxiliary layer and the material of the upper reflective layer.

The auxiliary layer may include an organic material, and the upper reflective layer may include a metal.

The upper reflective layer may include magnesium, and the organic material may include one of 8-quinolinolato lithium, N,N-diphenyl-N,N-bis(9-phenyl-9H-carbazole-3-yl)biphenyl-4,4'-diamine, N(diphenyl-4-yl)9,9-dimethyl-N-(4(9-phenyl-9H-carbazol-3-yl)phenyl)-9H-fluorene-2-amine, and 2-(4-(9,10-di(naphthalene-2-yl)anthracene-2-yl)phenyl)-1-phenyl-1H-benzo-[D]imidazole.

The auxiliary layer may directly contact the first counter electrode, and the upper reflective layer may directly contact the second counter electrode.

The auxiliary layer may overlie the first light emitting layer and may not overlie the second light emitting layer.

A thickness of the upper reflective layer may be greater than a thickness of the first counter electrode and may be greater than a thickness of the second counter electrode.

The first counter electrode and the second counter electrode may be integrally formed.

The first counter electrode and the second counter electrode may be formed of a same material.

The first counter electrode and the second counter electrode may include at least one of aluminum, silver, and magnesium.

The first pixel electrode may include a first lower transparent conductive layer on the substrate, a first metal layer on the first lower transparent conductive layer, and a first upper transparent conductive layer on the first metal layer, the second pixel electrode may include a second lower transparent conductive layer on the substrate, a second metal layer on the second lower transparent conductive layer, and a second upper transparent conductive layer on the second metal layer, and a thickness of the first metal layer may be greater than a thickness of the second metal layer.

The first metal layer and the second metal layer may be formed of a same material.

The display device may further include a first driving thin film transistor on the substrate, the first driving thin film transistor being electrically connected to the first pixel electrode; and a second driving thin film transistor on the substrate, second first driving thin film transistor being electrically connected to the second pixel electrode, wherein the first pixel electrode and the second pixel electrode are spaced apart from each other.

The first driving thin film transistor may underlie the first pixel electrode.

The second driving thin film transistor may not underlie the second light emitting layer.

The second driving thin film transistor may underlie the upper reflective layer.

The display device may further include a driving thin film transistor on the substrate, the driving thin film transistor being electrically connected to first pixel electrode, wherein the driving thin film transistor underlies the first pixel electrode.

The first pixel electrode may be connected to the second pixel electrode.

The embodiments may be realized by providing a method for manufacturing a display device, the method including preparing a substrate such that the substrate includes a first area and a second area; forming a first pixel electrode on the first area of the substrate, forming a second pixel electrode on the second area of the substrate; forming a first organic layer on the first pixel electrode such that the first organic layer includes a first light emitting layer, forming a second organic layer on the second pixel electrode such that the second organic layer includes a second light emitting layer; depositing a conductive material on the first organic layer and the second organic layer to form a first counter electrode on the first organic layer and a second counter electrode located on the second organic layer; forming an auxiliary layer on the first counter electrode such that the auxiliary layer overlies the first light emitting layer and does not overlie the second light emitting layer; and depositing a metal on the first area of the substrate and the second area of the substrate to form an upper reflective layer on the second counter electrode.

The auxiliary layer may include an organic material, and the upper reflective layer may include a metal.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
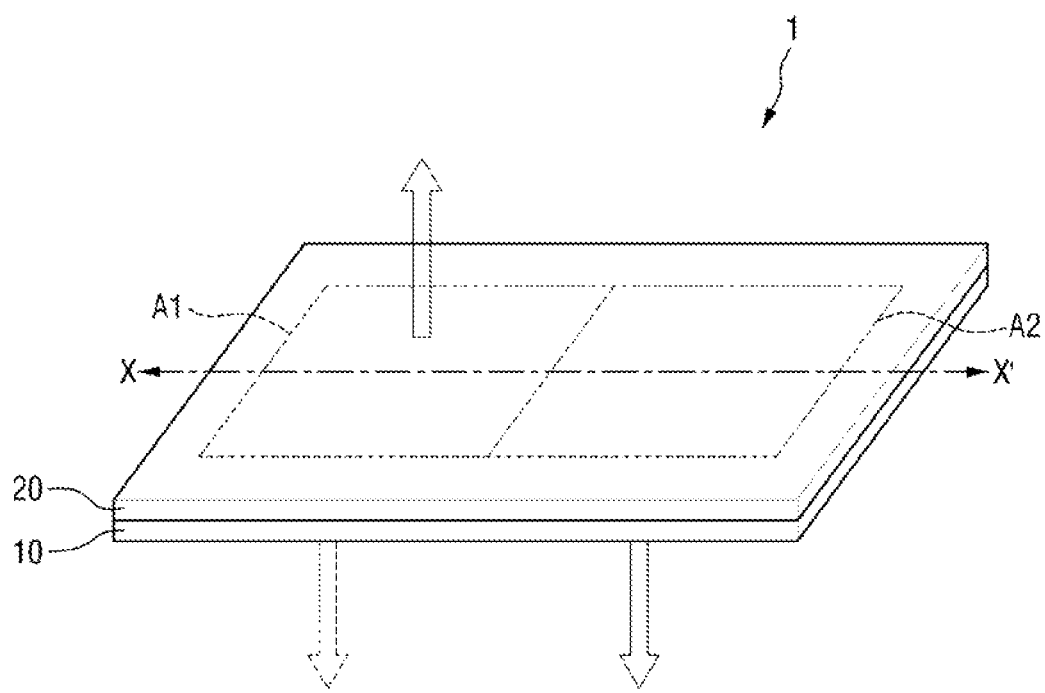
FIG. 1 illustrates a perspective view of a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings herein.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which the present application belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

FIG. 1 illustrates a schematic perspective view of a display device according to an embodiment.

Referring to FIG. 1, in the display device according to this embodiment, a display unit 20 may be located on a substrate 10 that includes a first area A1 and a second area A2.

In or on the first area A1, an image may be displayed at least in an upward direction of the substrate 10. For example, on the first area A1, the image may also be displayed in a downward direction of the substrate 10. For example, the first area A1 may include or may correspond to a front light emitting area or a double-sided light emitting area. A case where the first area A1 includes or corresponds to the front light emitting area will be described below by way of example.

In the second area A2, an image may be displayed at least in the downward direction of the substrate 10. For example, the second area A2 may include or correspond to a rear light emitting area.

For example, the display device according to this embodiment may display an image on both sides thereof on the basis of the substrate 10, and may consequentially display the image on both sides, using a single display unit 20 or a single substrate 10.

Figure 2:
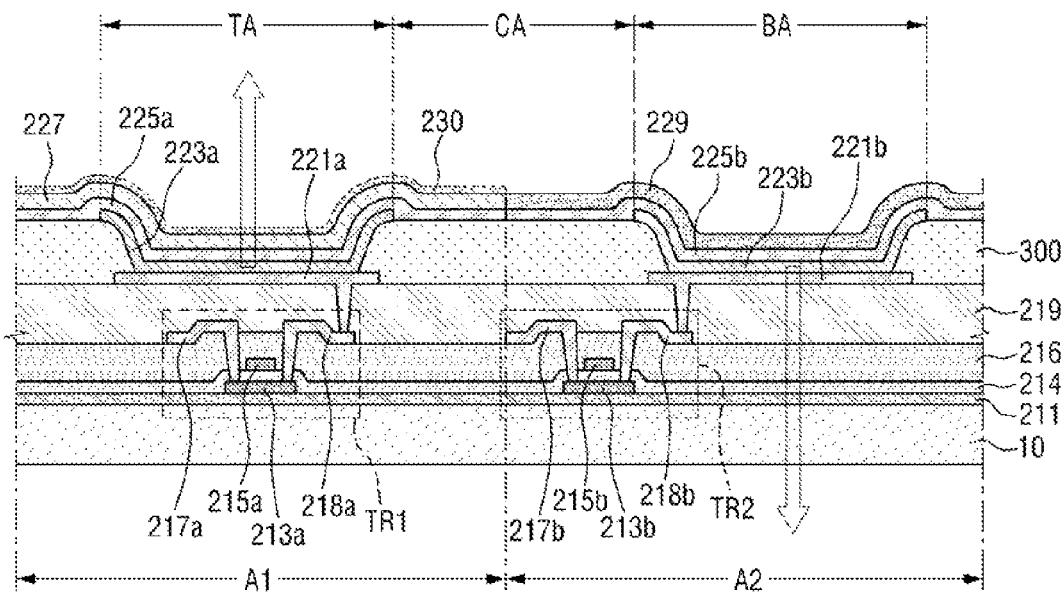
FIG. 2 illustrates a schematic cross-sectional view of a display device according to an embodiment.
Figure 3:
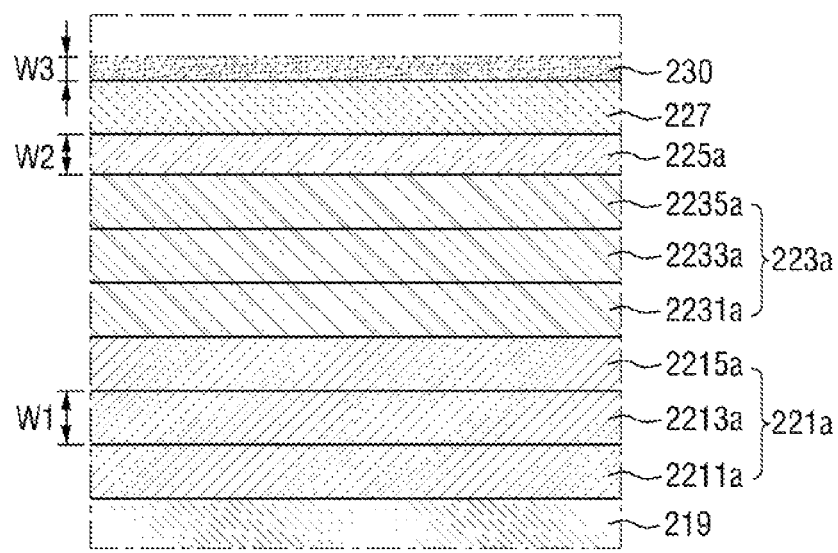
FIG. 3 illustrates an enlarged view of a part P of FIG. 2.
Figure 4:
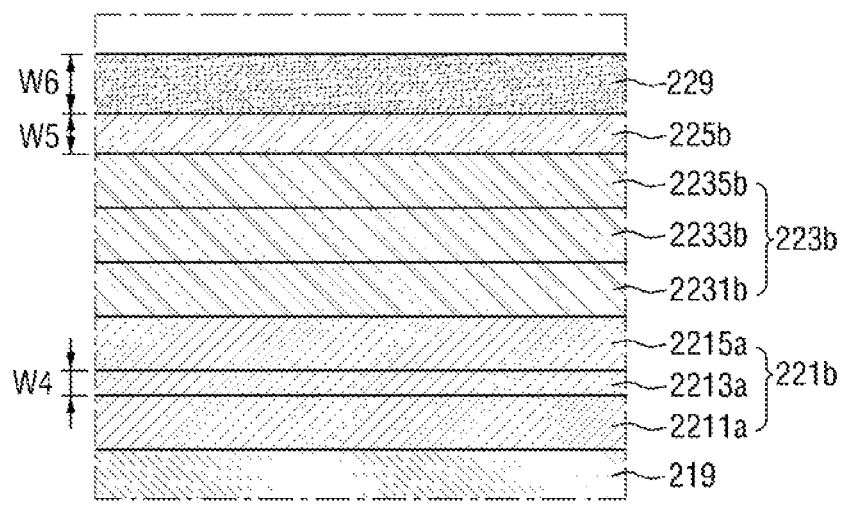
FIG. 4 illustrates an enlarged view of a part Q of FIG. 2.

FIG. 2 illustrates a schematic cross-sectional view of a display device according to an embodiment. For example, FIG. 2 illustrates a schematic cross-sectional view taken along a line X-X' of FIG. 1. FIG. 3 illustrates an enlarged view of a part P of FIG. 2, and FIG. 4 illustrates an enlarged view of a part Q of FIG. 2.

Referring to FIGS. 1 to 4, as described above, the display device according to an embodiment may include a display unit 20 on the substrate 10. The display unit 20 may include a buffer layer 211, a first driving thin film transistor TR1, a second driving thin film transistor TR2, a passivation layer 219, a first pixel electrode 221a, a second pixel electrode 221b, a first organic layer 223a, a second organic layer 223b, a first counter electrode 225a, a second counter electrode 225b, an auxiliary layer 227, and an upper reflective layer 229. In an implementation, the display unit may further include a residual pattern 230 of the upper reflective layer.

The substrate 10 may have a rectangular plate shape. One side of the substrate 10 may be flat, and various structures that constitute the display unit 20 may be formed on the flat side.

The substrate 10 may be a transparent insulating substrate. For example, the substrate 10 may be formed of a glass substrate, a quartz substrate, a transparent resin substrate, or the like. The substrate 10 may include a polymer having a high heat resistance. For example, the substrate 10 may include polyethersulfone (PES), polyacrylate (PAR), polyetherimide (PEI), polyethylene naphthalate (PEN), polyethyeleneterepthalate (PET), polyphenylene sulfide (PPS), polyallylate, polyimide (PI), polycarbonate (PC), cellulose triacetate, cellulose acetate propionate (CAP), poly (aryleneether sulfone), or combinations thereof.

The substrate 10 may also have flexibility. For example, the substrate 100 may be a substrate, the form of which may be modified by rolling, folding, bending, or the like.

The substrate 100 may include the first area A1, and the second area A2 (different from the first area A1).

In an implementation first area A1 and the second area A2 may be continuous with each other, as illustrated in FIG. 2, or they may be spaced apart from each other.

The buffer layer 211 may be located on the substrate 10. In an implementation, the buffer layer 211 may be on the first area A1 and the second area A2 of the substrate 10. The buffer layer 211 may help prevent a phenomenon in which metal atoms, impurities, or the like are diffused from the substrate 10. In an implementation, the buffer layer 211 may also help improve the flatness of the surface of the substrate 10, when the surface of the substrate 10 is not uniform.

The buffer layer 211 may be formed of a transparent insulator. For example, the transparent insulator may be a silicon compound. For example, the buffer layer 211 may include silicon oxide, silicon nitride, silicon oxynitride, silicon oxycarbide, silicon carbonitride, or the like. These elements may be used alone or in combination with each other. In an implementation, the buffer layer 211 may have a single-layer structure or a multi-layer structure which includes a silicon compound. For example, the buffer layer 211 may include a silicon oxide film, a silicon nitride film, a silicon oxynitride film, a silicon oxycarbide film, and/or a silicon carbonitride film. In an implementation, the buffer layer 211 may be omitted, according to the surface flatness, the constituents, or the like of the substrate 10.

A first semiconductor pattern 213a and a second semiconductor pattern 213b may be located on the buffer layer 211. The first semiconductor pattern 213a may be on the first area A1 of the substrate 10, and the second semiconductor pattern 213b may be on the second area A2 of the substrate 10. The first semiconductor pattern 213a and the second semiconductor pattern 213b may be made up of an amorphous semiconductor, a microcrystalline semiconductor, or a polycrystalline semiconductor. In an implementation, the first semiconductor pattern 213a and the second semiconductor pattern 213b may be made up of an oxide semiconductor. In an implementation, the oxide semiconductor may be made up of GIZO [$(In_2O_3)_a(Ga_2O_3)_b(ZnO)_c$ layer] (in which a, b, and c may be real numbers which satisfy conditions of a≥0, b≥0 and c≥0, respectively). In an implementation, the first semiconductor pattern 213a and the second semiconductor pattern 213b may include a channel section which is not doped with impurities, a source section formed by being p+doped on both sides of the channel section, and a drain section. At this time, the ionic materials to be doped may be P-type impurities such as boron (B), and, for example, $B_2H_6$ or the like may be used. Here, these impurities may vary depending on the types of thin film transistors. In an implementation, the first semiconductor pattern 213a and the second semiconductor pattern 213b may be formed of a same material and may be formed within a same process.

A gate insulating film 214 may be formed on the buffer layer 211 to cover the first semiconductor pattern 213a and the second semiconductor pattern 213b. Further, the gate insulating film 214 may be on the first area A1 and the second area A2 of the substrate 100. The gate insulating film 214 may be made up of an inorganic material. For example, the gate insulating film 214 may be made up of silicon oxide (SiOx), silicon nitride (SiNx), metal oxide, or the like. The metal oxides capable of being used in the gate insulating film 214 may include hafnium oxide (HfOx), aluminum oxide (AlOx), zirconium oxide (ZrOx), titanium oxide (TiOx), tantalum oxide (TaOx) or the like. These elements may be used alone or in combination with each other. The gate insulating film 214 may be substantially uniformly formed on the buffer layer 211 along the profiles of the first semiconductor pattern 213a and the second semiconductor pattern 213b. The gate insulating film 214 may have a relatively thin thickness, and step portions adjacent to the first semiconductor pattern 213a and the second semiconductor pattern 213b may be generated in the gate insulating film 214. In an implementation, the gate insulating film 214 may have a substantially flat upper surface, while sufficiently covering the first semiconductor pattern 213a and the second semiconductor pattern 213b. In this case, the gate insulating film 214 may have a relatively thick thickness.

The first gate electrode 215a and the second gate electrode 215b may be formed on the gate insulating film 214. The first gate electrode 215a may be on the first area A1 of the substrate 10 so as to overlap or overlie the first semiconductor pattern 213a, and the second gate electrode 215b may be on the second area A2 of the substrate 10 so as to overlap or overlie the second semiconductor pattern 213b. The first gate electrode 215a and the second gate electrode 215b may include a metal, an alloy, metal nitride, a conductive metal oxide, a transparent conductive material or the like. For example, the first gate electrode 215a and the second gate electrode 215b may include aluminum (Al), an alloy containing aluminum, aluminum nitride ($AlN_x$), silver (Ag), an alloy containing silver, tungsten (W), tungsten nitride ($WN_x$), copper (Cu), an alloy containing copper, nickel (Ni), chromium (Cr), chromium nitride ($CrO_x$), molybdenum (Mo), an alloy containing molybdenum, titanium (Ti), titanium nitride ($TiN_x$), platinum (Pt), tantalum (Ta), tantalum nitride ($TaN_x$), neodymium (Nd), scandium (Sc), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO) or the like. These elements may be used alone or in combination with each other. In an implementation, the first gate electrode 215a and the second gate electrode 215b may have a single-layer structure which is made of the above-mentioned metal, alloy, metal nitride, conductive metal oxide or a transparent conductive material. In an implementation, the first gate electrode 215a and the second gate electrode 215b may also be formed of a multi-layer structure which is made up of the above-mentioned metal, alloy, metal nitride, conductive metal oxide and/or transparent conductive material. In an implementation, the first gate electrode 215a and the second gate electrode 215b may be formed of a same material and may be formed within a same process.

In an implementation, the first gate electrode 215a and the second gate electrode 215b may have a substantially smaller width than that of the semiconductor pattern 104. For example, the first gate electrode 215a may have substantially identical or substantially similar width to that of the channel section of the first semiconductor pattern 213a. Similarly, the second gate electrode 215b may have substantially identical or substantially similar width to that of the channel section of the second semiconductor pattern 213b. The dimensions of the first gate electrode 215a and the second gate electrode 215b and/or the dimensions of the channel section may vary, depending on the electrical characteristics required for the switching elements including these elements.

The interlayer insulating film 216 may be formed on the gate insulating film 214 so as to cover the first gate electrode 215a and the second gate electrode 215b. The interlayer insulating film 216 may be on the first area A1 and the second area A2 of the substrate 10. In an implementation, the interlayer insulating film 216 may be made up of an inorganic insulating material. For example, the interlayer insulating film 216 may be made up of a silicon compound. The silicon compound may include silicon oxide, silicon nitride, silicon oxynitride, silicon carbonitride, silicon oxycarbide, or the like. These elements may be used alone or in combination with each other. The interlayer insulating film 216 may have a single-layer structure or a multi-layer structure including the above-described silicon oxide, silicon nitride, silicon oxynitride, silicon carbonitride, silicon oxycarbide, or the like. The interlayer insulating film 216 may also be made of substantially the same material as that of the gate insulating film 214.

The first source electrode 217a and the first drain electrode 218a may be formed on the interlayer insulating film 216. The first source electrode 217a and the first drain electrode 218a may be on the first area A1 of the substrate 10. The first source electrode 217a and the first drain electrode 218a may be spaced apart from each other around the first gate electrode 213a at a predetermined interval, and may be adjacent to the first gate electrode 213a. For example, each of the first source electrode 217a and the first drain electrode 218a may contact the source section and the drain section of the first semiconductor pattern 213a through the interlayer insulating film 216 and the gate insulating film 214.

Similarly, the second source electrode 217b and the second drain electrode 218b may be formed on the interlayer insulating film 216 and may be on the second area A2 of the substrate 10. The second source electrode 217b and the second drain electrode 218b may be spaced apart from each other around the second gate electrode 213b at a predetermined interval and may be adjacent to the second gate electrode 213b. For example, each of the second source electrode 217b and the second drain electrode 218b may contact the source section and the drain section of the second semiconductor pattern 213b through the interlayer insulating film 216 and the gate insulating film 214.

Each of the first source electrode 217a, the first drain electrode 218a, the second source electrode 217b, and the second drain electrode 218b may include metal, alloy, metal nitride, conductive metal oxide, transparent conductive material, or the like. For example, each of the first source electrode 217a, the first drain electrode 218a, the second source electrode 217b, and the second drain electrode 218b may be made of aluminum, an alloy containing aluminum, aluminum nitride, silver, an alloy containing silver, tungsten, tungsten nitride, copper, an alloy containing copper, nickel, chromium, chromium nitride, molybdenum, an alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, or the like. These elements may be used alone or in combination with each other. Each of the first source electrode 217a, the first drain electrode 218a, the second source electrode 217b and the second drain electrode 218b may have a single-layer structure or a multi-layer structure made up of the above-mentioned metal, alloy, metal nitride, conductive metal oxide, transparent conductive material or the like. In an implementation, the first source electrode 217a, the first drain electrode 218a, the second source electrode 217b and the second drain electrode 218b may be formed of a same material one another and may be formed within a same process.

As the first source electrode 217a and the first drain electrode 218a are formed on the interlayer insulating film 216, a first driving thin film transistor TR1 may be provided on the substrate 10. The first driving thin film transistor TR1 may include the first semiconductor pattern 213a, the gate insulating film 214, the first gate electrode 215a, the first source electrode 217a and the first drain electrode 218a as the switching elements of the display device. The first driving thin film transistor TR1 may be on the first area A1 of the substrate 10. Similarly, as the second source electrode 217b and the second drain electrode 218b are formed on the interlayer insulating film 216, the second driving thin film transistor TR2 may be provided on the substrate 10. The second driving thin film transistor TR2 may include the second semiconductor pattern 213b, the gate insulating film 214, the second gate electrode 215b, the first source electrode 217b and the second drain electrode 218b as the switching elements of the display device. The second driving thin film transistor TR2 may be on the second area A2 of the substrate 10. The first driving thin film transistor TR1 and the second driving thin film transistor TR2 may be a top gate type thin film transistor or they may be a bottom gate type thin film transistor or the like.

The passivation layer 219 may be on the interlayer insulating film 216 and may cover the first source electrode 217a, the first drain electrode 218a, the second source electrode 217b and the second drain electrode 218b. For example, the passivation layer 219 may cover the first driving thin film transistor TR1 and the second driving thin film transistor TR2. The passivation layer 219 may be on the first area A1 and the second area A2 of the substrate 10. The surface of the passivation layer 219 may be flat. For example, the passivation layer 219 may have a shape whose upper surface is flattened. The passivation layer 219 may be made up of an insulating material, and the insulating material may include an organic material or an inorganic material. The passivation layer 219 may be formed of a single-layer structure or may be formed of a multi-layer structure which includes at least two or more insulating films.

The first pixel electrode 221a and the second pixel electrode 221b may be on the passivation layer 219. For example, the first pixel electrode 221a may be on the first area A1 of the substrate 10, and the second pixel electrode 221b may be on the second area A2 of the substrate 10. In an implementation, the first pixel electrode 221a and the second pixel electrode 221b may be electrically insulated from each other and may be physically spaced apart from each other. The first pixel electrode 221a may be electrically connected to the first drain electrode 218a through the passivation layer 219, and the second pixel electrode 221b may be electrically connected to the second drain electrode 218b though the passivation layer 219.

The first pixel electrode 221a and/or the second pixel electrode 221b may be an anode electrode or a cathode electrode. When the first pixel electrode 221a and/or the second pixel electrode 221b are an anode electrode, a first counter electrode 225a and/or a second counter electrode 225b, which will be described later, may be a cathode electrode. For convenience of description, a case where the first pixel electrode 221a and the second pixel electrode 221b are the anode electrode will be described below as an example.

When the first pixel electrode 221a and the second pixel electrode 221b are used as the anode electrode, the first pixel electrode 221a and the second pixel electrode 221b may be made of or may include, e.g., a conductive material having a high work function. When the display device is a rear emission type display device, the conductive material may include, e.g., indium-tin-oxide (ITO), indium-zinc-oxide (IZO), zinc oxide (ZnO), indium oxide ($In_2O_3$), Al doped ZnO (AZO), or the like. The exemplary conductive materials have transparent characteristics, while having the relatively large work function. Thus, when the display device is a rear emission type or double-sided emission type, it is possible to form the first pixel electrode 221a and the second pixel electrode 221b with a conductive layer including the exemplified conductive material or a laminated film thereof. In an implementation, when the display device is a front emission type, in addition to the exemplified conductive materials, a reflective material, e.g., silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), or a mixture thereof may be further included. In an implementation, the first pixel electrode 221a and the second pixel electrode 221b may have a single-layer structure made up of the conductive material and the reflective material or may have a multi-layer structure in which they are laminated. In an implementation, the first pixel electrode 221a and the second pixel electrode 221b may have, e.g., a multiple layer structure of ITO/Mg, ITO/MgF, ITO/Ag and ITO/Ag/ITO.

In a case where the front light emitting area TA is on or corresponds to the first area A1 and the rear light emitting area BA is on or corresponds to the second area A2, the first pixel electrode 221a may have light reflection characteristics and the second pixel electrode 221b may have light transmission characteristics. The first pixel electrode 221a may be made of or may have, e.g., a multi-layer structure within a range having the light reflection characteristics, and the second pixel electrode 221b may be made of or may have, e.g., a multi-layer structure within a range having the light transmission characteristics.

In an implementation, the first pixel electrode 221a may be made of or include, e.g., a laminated body of a first lower transparent conductive layer 2211a, a first metal layer 2213a, and a first upper transparent conductive layer 2215a. The first lower transparent conductive layer 2211a and the first upper transparent conductive layer 2215a may include, e.g., ITO, IZO, ZnO, AZO or $In_2O_3$ having the high work function as described above. The first metal layer 2213a may include, e.g., the above-mentioned reflective material or Ag, Mg, Al, Pt, Pd, Au, Ni, Nd, Ir, Cr, Li, Ca, Yb or compounds thereof. For example, the first metal layer 2213a may be a reflective film. A thickness W1 of the first metal layer 2213a may be appropriately adjusted within a desired range to provide the functionality of the reflective film. In an implementation, when the first metal layer 2213a is formed of, e.g., silver (Ag), in order to help secure the light reflection characteristics, the thickness W1 may be, e.g., greater than 1,000 Å.

In an implementation, the second pixel electrode 221b may be made of or include, e.g., a laminated body of a second lower transparent conductive layer 2211b, a second metal layer 2213b, and a second upper transparent conductive layer 2215b. The second lower transparent conductive layer 2211b and the second upper transparent conductive layer 2215b may include, e.g., ITO, IZO, ZnO, AZO or $In_2O_3$ having the high work function as described above. The second metal layer 2213b may include, e.g., the above-mentioned reflective material, or Ag, Mg, Al, Pt, Pd, Au, Ni, Nd, Ir, Cr, Li, Ca, Yb or compounds thereof. The second metal layer 2213b may be formed of a thin film so as to have high light transmittance. In an implementation, a thickness W4 of the second metal layer 2213b may be smaller than the thickness W1 of the first metal layer 2213a. When the second metal layer 2213b is formed of silver (Ag), in order to help secure the light transmission characteristics, the thickness W4 may be, e.g., smaller than 200 Å. The first lower transparent conductive layer 2211a and the second lower transparent conductive layer 2211b may be made of a same material, and may be formed within a same process. Similarly, the first metal layer 2213a and the second metal layer 2213b may be made of a same material and may be formed within a same process. The same may also be true for the case of the first upper transparent conductive layer 2215a and the second upper transparent conductive layer 2215b.

In an implementation, the structures of the first pixel electrode 221a and the second pixel electrode 221b may be variously modified within a range in which the first pixel electrode 221a has the light reflection characteristics and the second pixel electrode 221b has the light transmission characteristics. For example, the second pixel electrode 221b may not be provided with a separate second metal layer 2213b and/or may include only one of a second lower transparent conductive layer 2211b, a second metal layer 2213b, and a second upper transparent conductive layer 2215b.

In an implementation, the first pixel electrode 221a (having the light reflection characteristics) may overlap, overlie, or otherwise be aligned with the first driving thin film transistor TR1, e.g., the first driving thin film transistor TR1 may be between the first pixel electrode 221a and the substrate 10. For example, a path of light generated by a first organic layer 223a (to be described below) may not be affected by the first driving thin film transistor TR1, and the first pixel electrode 221a may overlap or overlie the first driving thin film transistor TR1. Thus, it is possible to prevent the first driving thin film transistor TR1 from being visually recognized, when viewed from outside of the display device, e.g., from the upper side of the display device or the substrate 10. For example, it is possible to help reduce an occurrence of distortion of the image, which may otherwise occur due to external light being scattered by the electrodes of the first driving thin film transistor TR1.

A pixel defining film 300 may be on the passivation layer 219 so as to cover edges of the first pixel electrode 221a and the second pixel electrode 221b. The pixel defining film 300 may expose a part of the first pixel electrode 221a and the second pixel electrode 221b. The pixel defining film 300 may be made of or may include, e.g., at least one organic material selected from benzocyclobutene (BCB), polyimide (PI), polyamide (PA), acrylic resin, phenol resin or the like.

The first organic layer 223a may be on the first pixel electrode 221a that is exposed by the pixel defining film 300, and the second organic layer 223b may be on the second pixel electrode 221b that is exposed by the pixel defining film 300. The first organic layer 223a may be on the first area A1 of the substrate 10, and the second organic layer 223b may be on the second area A2 of the substrate 10. When current is applied to the first organic layer 223a and the second organic layer 223b, the electrons and holes in the first organic layer 223a and the second organic layer 223b may be recombined with each other to form exciton, and light of a specific wavelength may be generated by energy from the formed exciton.

The first organic layer 223a may include, e.g., a first lower organic film 2231a, a first light emitting layer 2233a, and a first upper organic film 2235a. The second organic layer 223b may include, e.g., a second lower organic film 2231b, a second light emitting layer 2233b, and a second upper organic film 2235b.

The first lower organic film 2231a may be on the first pixel electrode 221a, and similarly, the second lower organic film 2231b may be on the second pixel electrode 221b.

Each of the first lower organic film 2231a and the second lower organic film 2231b may include, e.g., at least one of a hole injection layer (HIL) and a hole transfer layer (HTL).

The hole injection layer may include, e.g., a phthalocyanine compound such as copper phthalocyanine (CuPc), m-MTDATA (4,4',4"-tris(N-3-methylphenyl-N-phenylamino)triphenylamine), TDATA (4,4',4"-tris(diphenylamino)triphenylamine, 2-TNATA(4,4',4"-tris[2-naphthyl(phenyl)-amino]triphenyl-amine, Pani/DBSA (Polyaniline/Dodecylbenzenesulfonic acid), PEDOT/PSS(Poly(3,4-ethylene dioxythiophene)/Polystyrene sulfonate), PANI/CSA (Polyaniline/Camphorsulfonic acid) or PANI/PSS (Polyaniline/Polystyrene sulfonate).

The hole transfer layer may include, e.g., NPD (4,4'-bis[N-(1-napthyl)-N-phenyl-amino] biphenyl), TPD (N,N'-diphenyl-N,N'-bis[3-methylphenyl]-1,1'-biphenyl-4,4'-diamine), s-TAD (2,2',7,7'-tetrakis-(N,N-diphenylamino)-9,9'-spirobifluoren), m-MTDATA (4,4',4"-tris(N-3-methylphenyl-N-phenylamino)triphenylamine) or the like.

In an implementation, each of the first lower organic film 2231a and the second lower organic film 2231b may further include a charge generating material for improving conductivity, other than the above-mentioned materials. The charge generating material may be uniformly or non-uniformly dispersed within the first lower organic film 2231a and the second lower organic film 2231b. The charge generating material may be, e.g., a p-dopant. The p-dopant may be one of, e.g., quinone derivatives, metal oxide and cyano group-containing compound. Examples of p-dopant may include quinone derivatives such as TCNQ (Tetracyanoquinodimethane) and F4-TCNQ(2,3,5,6-tetrafluoro-tetracyanoquinodimethane); and metal oxide such as tungsten oxide and molybdenum oxide.

A first light emitting layer 2233a may be on the first lower organic film 2231a, and a second light emitting layer 2233b may be on the second lower organic film 2231b. In an implementation, each of the first light emitting layer 2233a and the second light emitting layer 2233b may be made of or may include, e.g., a material that emits red, green, and/or blue light.

In an implementation, the first light emitting layer 2233a and the second light emitting layer 2233b may include a host and a dopant. The host may include, e.g., tris(8-hydroxyquinolinato)aluminum (Alq3), 9,10-di(napth-2-yl)anthracene (ADN), 3-tert-butyl-9,10-di(napth-2-yl)anthracene (TBADN), 4,4'-bis(2,2-diphenyl-ethene-1-yl)-4,4'-dimethylphenyl (DPVBi), 4,4'-bis(2,2-diphenyl-ethene-1-yl)-4,4'-dimethylphenyl (p-DMDPVBi), tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene(TSDF), bis(9,9-diarylfluorene)s (BDAF), 4,4'-bis(2,2-diphenyl-ethene-1-yl)-4,4'-di-(tert-butyl)phenyl (p-TDPVBi), 1,3-bis(carbazol-9-yl)benzene (mCP), 1,3,5-tris(carbazol-9-yl)benzene (tCP), 4,4',4"-tris(carbazol-9-yl)triphenylamine (TcTa), 4,4'-bis(carbazol-9-yl)biphenyl (CBP), 4,4'-bis(9-carbazolyl)-2,2'-dimethyl-biphenyl (CBDP), 4,4'-bis(carbazol-9-yl)-9,9-dimethyl-fluorene (DMFL-CBP), 4,4'-bis(carbazol-9-yl)-9,9-bis(9-phenyl-9H-carbazol)fluorene (FL-4CBP), 4,4'-bis(carbazol-9-yl)-9,9-di-tolyl-fluorene (DPFL-CBP), 9,9-bis(9-phenyl-9H-carbazol)fluorene (FL-2CBP) or the like.

The dopant may include, e.g., 4,4'-bis[4-(di-p-tolylamino)styryl] biphenyl (DPAVBi), 9,10-di(naph-2-tyl)anthracene (ADN), 3-tert-butyl-9,10-di(naph-2-tyl)anthracene (TBADN) or the like, and in addition, it is also possible to use both a fluorescent dopant and a phosphorescent dopant. Further, the type of dopant may vary depending on the emission color of the first light emitting layer 2233a and the second light emitting layer 2233b.

A first upper organic film 2235a may be on the first light emitting layer 2233a, and a second upper organic film 2235b may be on the second light emitting layer 2233b. In an implementation, each of the first upper organic film 2235a and the second upper organic film 2235b may include at least any one of an electron injection layer (EIL) and an electron transfer layer (ETL).

The electron transfer layer may include, e.g., Alq3(tris-(8-hydroyquinolato) aluminum (III)), TPBi(1,3,5-tris(N-phenylbenzimiazole-2-yl)benzene, BCP(2,9-dimethyl-4,7-diphenyl-1,10-phenanthroline), Bphen(4,7-diphenyl-1,10-phenanthroline), TAZ(3-(Biphenyl-4-yl)-5-(4-tert-butylphenyl)-4-phenyl-4H-1,2,4-triazole), NTAZ(4-(naphthalen-1-yl)-3,5-diphenyl-4H-1,2,4-triazole), tBu-PBD(2-(4-biphenylyl)-5-(4-tert-butyl-phenyl)-1,3,4-oxadiazole), BAlq(Bis2-methyl-8-quinolinolato-N1,O8)-(1,1'-Biphenyl-4-olato)aluminum), Bebq2(Bis(10-hydroxybenzo[h]quinolinato)beryllium), AND(9,10-bis(2-naphthyl)anthracene) or a mixture thereof.

The electron injection layer may include, e.g., lanthanide metals such as LiF, Liq (8-Quinolinolato Lithium), Li$_2$O, BaO, NaCl, CsF, and Yb, or metal halides such as RbCl and RbI. The electron injection layer may also be made of or may include, e.g., a material obtained by mixing the above-mentioned materials with an insulating organo metal salt. The applied organo metal salt may be a material having an energy band gap of about 4 eV or more. In an implementation, the organo metal salt may include, e.g., metal acetate, metal benzoate, metal acetoacetate, metal acetylacetonate or a metal stearate.

In an implementation, each of the first upper organic film 2235a and the second upper organic film 2235b may further include a particular dopant material so that the metal for forming the first counter electrode 225a and/or the second counter electrode 225b, which will be described later, is deposited well. In an implementation, the dopant materials may include, e.g., di-tungsten tetra (hexahydropyrimidopyrimidine) or the like.

The first counter electrode 225a may be on the pixel defining film 300 and the first organic layer 223a on the first area A1 of the substrate 10, and the second counter electrode 225b may be on the pixel defining film 300 and the second organic layer 223b on the second area A2 of the substrate 10. When the first counter electrode 225a and the second counter electrode 225b are a cathode electrode, the first counter electrode 225a and the second counter electrode 225b may be made of or may include, e.g., a conductive material having a low work function. In an implementation, the first counter electrode 225a and/or the second counter electrode 225b may include, e.g., Ag, Mg, Al, Pt, Pd, Au, Ni, Nd, Ir, Cr, Li, Ca, alloys thereof or the like. In an implementation, the first counter electrode 225a and/or the second counter electrode 225b may include, e.g., aluminum (Al), silver (Ag), or an alloy (Mg:Ag) of magnesium and silver.

The first counter electrode 225a and/or the second counter electrode 225b may have light transmission characteristics and may be formed of or as a thin film so as to have the high light transmittance. In an implementation, a thickness W2 of the first counter electrode 225a and/or a thickness W5 of the second counter electrode 225b may be, e.g., 5 to 100 Å. The first counter electrode 225a and the second counter electrode 225b may be integrally constituted or integrally formed, and may be formed of a same material within a same process. The thickness W2 of the first counter electrode 225a and the thickness W5 of the second counter electrode 225b may be substantially the same. For example, the first counter electrode 225a and the second counter electrode 225b may be formed by depositing a same conductive material on the pixel defining film 300, the first organic layer 225a, and the second organic layer 225b by a suitable vacuum deposition process.

An auxiliary layer 227 may be on the first counter electrode 225a. The auxiliary layer 227 may be on the first area A1 of the substrate 10. In an implementation, the auxiliary layer 227 may overlap or overlie the first organic layer 223a and may not overlap or overlie the second organic layer 223b. For example, the auxiliary layer 227 may be provided only on the first area A1 of the substrate 10, and may be omitted from the second area A2 of the substrate 10. In an implementation, the auxiliary layer 227 may be directly on the first counter electrode 225a to directly contact the first counter electrode 225a.

The auxiliary layer 227 may have the light transmission characteristics and may include an organic material (e.g., an organometallic material). In an implementation, the auxiliary layer 227 may include, e.g., 8-Quinolinolato Lithium (Liq), N,N-diphenyl-N,N-bis(9-phenyl-9H-carbazole-3-yl) biphenyl-4,4'-diamine (HT01), N(diphenyl-4-yl)9,9-dimethyl-N-(4(9-phenyl-9H-carbazol-3-yl)phenyl)-9H-fluorene-2-amine (HT211), or 2-(4-(9,10-di(naphthalene-2-yl)anthracene-2-yl)phenyl)-1-phenyl-1H-benzo-[D]imidazole (LG201).

An upper reflective layer 229 may be on the second counter electrode 225b. The upper reflective layer 229 may be on the second area A2 of the substrate 10. In an implementation, the upper reflective layer 229 may overlap or overlie the second organic layer 223b and may not overlap or overlie the first organic layer 223a. For example, the upper reflective layer 229 may be included only on the second area A2 of the substrate 10, and may be omitted from the first area A1 of the substrate. In an implementation, the upper reflective layer 229 may be directly on the second counter electrode 225b to directly contact the second counter electrode 225b. The upper reflective layer 229 may be formed of or may include reflective materials, e.g., lithium (Li), calcium (Ca), lithium fluoride/calcium (LiF/Ca), lithium fluoride/aluminum (LiF/Al), aluminum (Al), silver (Ag), magnesium (Mg) or gold (Au). In an implementation, the upper reflective layer 229 may be made of or may include, e.g., Mg or an Mg alloy. The first counter electrode 225a and the second counter electrode 225b may have the light transmission characteristics, and the upper reflective layer 229 may have the light reflection characteristics. A thickness W6 of the upper reflective layer 229 may be greater than the thickness W2 of the first counter electrode 223a and the thickness W5 of the second counter electrode 225b. For example, the thickness W6 of the upper reflective layer 229 may be greater than the thickness W2 of the first counter electrode 223a and may be greater than the thickness W5 of the second counter electrode 225b. In an implementation, when the upper reflective layer 229 includes Mg or the Mg alloys, in order to help secure the light reflection characteristics, the thickness W6 of the upper reflective layer 229 may be greater than 1,000 Å.

The upper reflective layer 229 may be formed using an open mask rather than a fine metal mask. For example, the upper reflective layer 229 may be formed by a method of depositing the reflective material on the second counter electrode 225b and the auxiliary layer 227 by the use of the open mask. For example, the upper reflective layer 229 can be formed by depositing the reflective material both on the first area A1 and the second area A2 of the substrate 10 by the use of the open mask. Here the open mask means a mask with a widely open aperture without a fine pattern, unlike the fine metal mask.

The reflective material for forming the upper reflective layer 229, e.g., the metal containing Mg or the Mg alloy, may be well deposited on the second counter electrode 225b, and may not be well deposited on the auxiliary layer 227. The second counter electrode 225b may include a metal material, e.g., aluminum (Al), silver (Ag), or magnesium and silver alloy (Mg:Ag), and may have good adhesion or adhesive force to the reflective forming material of the upper reflective layer 229. However, the reflective material for forming the upper reflective layer 229, e.g., the metal containing Mg or the Mg alloy, may exhibit poor adhesion to the material (e.g., organic material) for forming the auxiliary layer 227. Therefore, even if the reflective material for forming the upper reflective layer 229, e.g., Mg or the Mg alloy were to be deposited on both the second counter electrode 225b and the auxiliary layer 227 by the use of the open mask, the reflective material may only be deposited (e.g., may only remain) on the second counter electrode 225b and may rarely be deposited on (e.g., may not remain on or adhere to) the auxiliary layer 227. Therefore, it is possible to automatically or easily obtain the patterning effect of the upper reflective layer 227.

If a fine metal mask were to be used to form the upper reflective layer 229, the deposition temperature may be relatively high, and the fine metal mask could be deformed during long-term use. Thus, very unstable process factors, e.g., occurrence of a shadow phenomenon, may occur. According to an embodiment, based on the properties of the material of the auxiliary layer 227, the material of the second counter electrode 225b, and the material of the upper reflective layer 227, it is possible to obtain the patterning effect of the upper reflective layer 229 without using a fine metal mask. Therefore, it is possible to avoid the above-described drawbacks of using a fine metal mask.

When the reflective material is deposited by the use of the open mask to form the upper reflective layer 229, a part of the reflective material may still be deposited or remain on the top of the auxiliary layer 227. For example, the residual pattern 230 of the upper reflective layer (made of the reflective material) may be further located on the top of the auxiliary layer 227. The residual pattern 230 may be in the form of thin layer or in the form of particles. A thickness W3 of the residual pattern 230 of the upper reflective layer may be smaller than the thickness W6 of the upper reflective layer 229.

In an implementation, the upper reflective layer 229 may overlap or overlie the second driving thin film transistor TR2, e.g., the second driving thin film transistor TR2 may be between the upper reflective layer 229 and the substrate 10. The path of light generated by the second organic layer 223b may not be affected by the second driving thin film transistor TR2 (e.g., the majority of second driving thin film transistor TR2 may not be between the second organic layer 223b and the substrate 10), and the upper reflective layer 229 may overlie the second driving thin film transistor TR2. Accordingly, it is possible to help prevent the second driving thin film transistor TR2 from being visually recognized, when viewed from the outside of the display device, e.g., from the upper or outer side of the substrate 10. Moreover, it is possible to help reduce to an occurrence of distortion of the image, due to scattering of the external light caused by the electrodes of the second driving thin film transistor TR2.

As described above, the first counter electrode 225a may be on the first organic layer 223a and the second counter electrode 225b may be on the second organic layer 223b, and a first organic light emitting element and a second organic light emitting element may be provided on the substrate 10 as the display elements of the display device. The first organic light emitting element may include the first pixel electrode 221a, the first organic layer 223a, and the first counter electrode 225a, and the second organic light emitting element may include the second pixel electrode 221b, the second organic layer 223b and the second counter electrode 225b. Further, the first pixel electrode 221a may have light reflection characteristics, the first counter electrode 225a and the auxiliary layer 227 may have light transmission characteristics, and light emitted from the first organic layer 223a may be provided to the first counter electrode 225a side or the upper side of the substrate 10. For example, a front light emitting area TA embodying an image to the upward direction side of the substrate 10 may be at or on the first area A1. In addition, the second pixel electrode 221b and the second counter electrode 225b may have the light transmission characteristics, the upper reflective layer 229 having the light reflective characteristics may be on the second counter electrode 225b, the light emitted from the second organic film 223a may be provided to the lower side of the second pixel electrode 223b or the substrate 10. For example, the rear light emitting area BA embodying an image to the downward direction side of the substrate 10 may be at or on the second area A2. In an implementation, a non-light emitting area CA (from which light is not emitted) may be between the front light emitting area TA and the rear light emitting area BA. For example, a part of the non-light emitting area CA and the front light emitting area TA may be located at or on the first area A1, and another part of the non-light emitting area CA and the rear light emitting area BA may be located at or on the second area A2. In an area of the non-light emitting area CA that does not overlap the upper reflective layer 229 and the second driving thin film transistor TR2, external light may be transmitted through the display device.

According to the above-described example, it is possible to form the front light emitting area TA and the rear light emitting area BA on a single substrate 10. Also, the light emission from the front light emitting area TA and the light emission from the rear light emitting area BA may be controlled using the separate driving thin film transistors, respectively, and it is possible to display the different images on both sides of the display device.

FIGS. 5 to 10 illustrate cross-sectional views of stages in a method of manufacturing the display device illustrated in FIG. 2.

Referring to FIGS. 5 to 10, first, the substrate 10 (including the first area A1 and the second area A2) may be prepared. Next, the buffer layer 211 may be formed on the first area A1 and the second area A2 of the substrate 10. Next, the first driving thin film transistor TR1 and the second driving thin film transistor TR2 may be formed on the buffer layer 211 at the first area A1 and the second area A2 of the substrate 10. Next, the passivation layer 219 may be formed on the substrate 10 to cover the first driving thin film transistor TR1 and the second driving thin film transistor TR2, and the first pixel electrode 221a connected to the first driving thin film transistor TR1 and the second pixel electrode 221b connected to the second driving thin film transistor TR2 may be formed on the passivation layer 219. The first pixel electrode 221a may be connected to the first driving thin film transistor TR1 through the passivation layer 219, and the second pixel electrode 221b may be connected to the second driving thin film transistor TR2 through the passivation layer 219.

Processes of forming the first driving thin film transistor TR1 and the second driving thin film transistor TR2 may include, e.g., a process of forming a first semiconductor pattern 213a and a second semiconductor pattern 213b on the buffer layer 211, a process of forming a gate insulating film 214 on the buffer layer 211 to cover the first semiconductor pattern 213a and the second semiconductor pattern 213b, a process of forming an interlayer insulating film 216 on the gate insulating film 214, and a process of forming a first source electrode 217a, a first drain electrode 218a, a second source electrode 217b and a second drain electrode 218b on the interlayer insulating film 216. The first source electrode 217a and the first drain electrode 218a may be connected to the first semiconductor pattern 213a through the interlayer insulating film 216, and the second source electrode 217b and the second drain electrode 218b may be connected to the second semiconductor pattern 213b through the interlayer insulating film 216. The respective other configuration are the same as those described in FIGS. 2 to 4, and repeated detailed descriptions thereof may be omitted.

Figure 6:
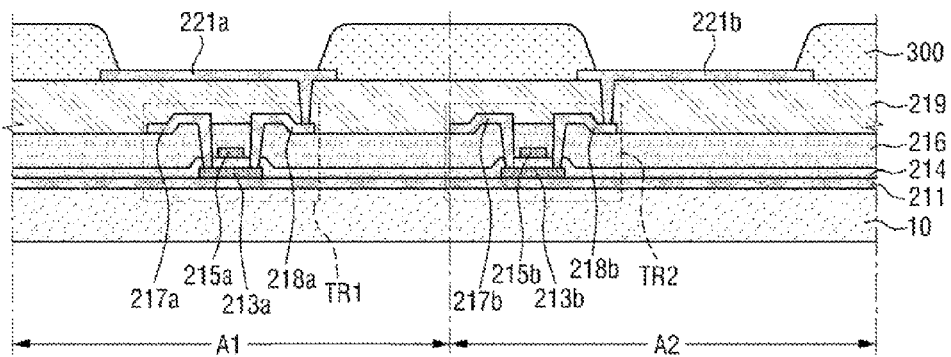

Thereafter, as illustrated in FIG. 6, a pixel defining film 300 may be formed on the passivation layer 219. The pixel defining film 300 may cover edges of the first pixel electrode 221a and the second pixel electrode 221b, and may have an aperture that exposes the first pixel electrode 221a and the second pixel electrode 221b.

Figure 7:
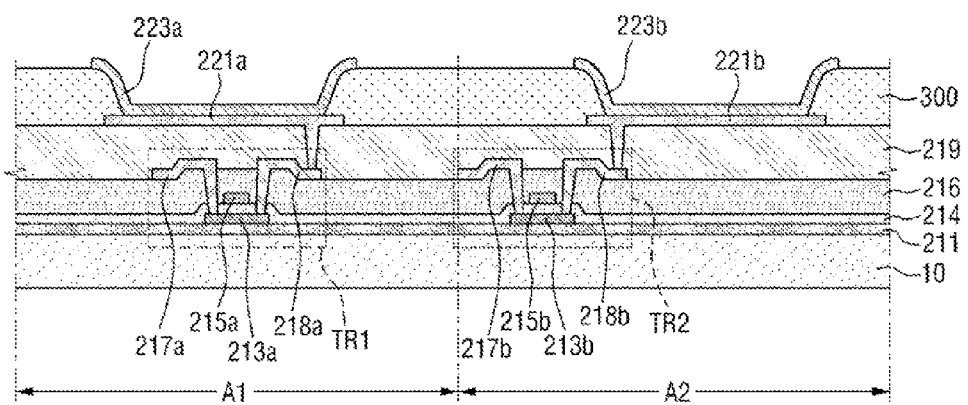

Thereafter, as illustrated in FIG. 7, the first organic layer 223a may be formed on the first pixel electrode 221a, and the second organic layer 223b may be formed on the second pixel electrode 221b. The process of forming the first organic layer 223a and the process of forming the second organic layer 223b may be carried out within a same process, e.g., in a single step or operation.

Figure 8:
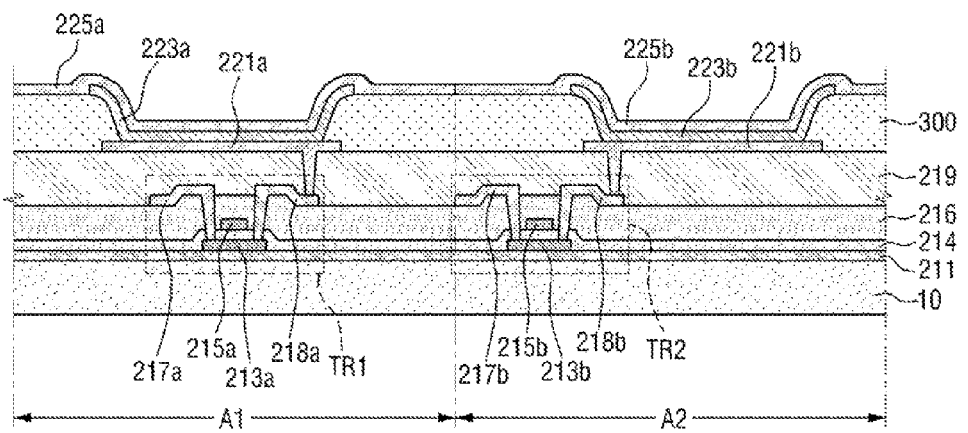

Thereafter, as illustrated in FIG. 8, a metal or the like may be deposited on the first organic layer 223a, the second organic layer 223b, and the pixel defining film 300 to form the first counter electrode 225a and the second counter electrode 225b. In an implementation, an open mask may be utilized when forming the first counter electrode 225a and the second counter electrode 225b.

Figure 9:
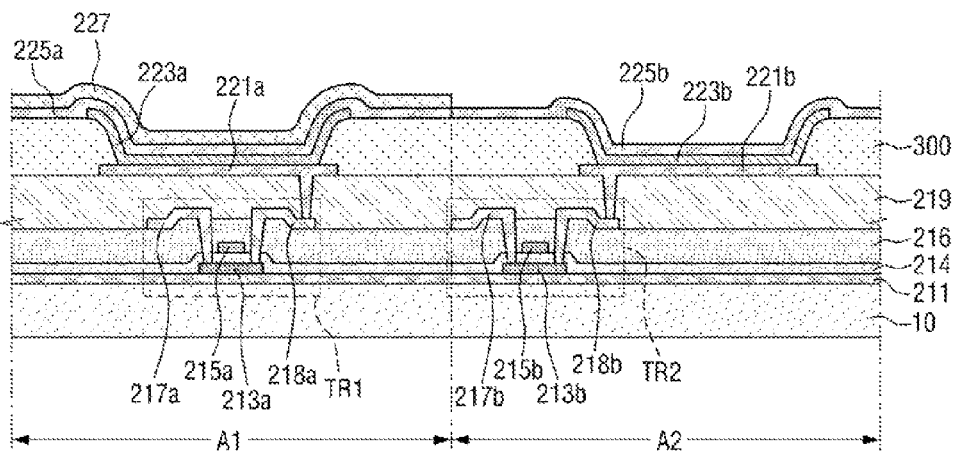

Thereafter, as illustrated in FIG. 9, an auxiliary layer 227 may be formed on the first counter electrode 225a. In an implementation, as described above in the description of FIGS. 2 to 4, the auxiliary layer 227 may be formed only on the first area A1 of the substrate 10. For example, the auxiliary layer 227 may not be located on the second counter electrode 225b. In an implementation, the auxiliary layer 227 may not overlap or overlie the second organic layer 223b, e.g., the second organic layer 223b may not be between the auxiliary layer 227 and the substrate 10.

Figure 10:
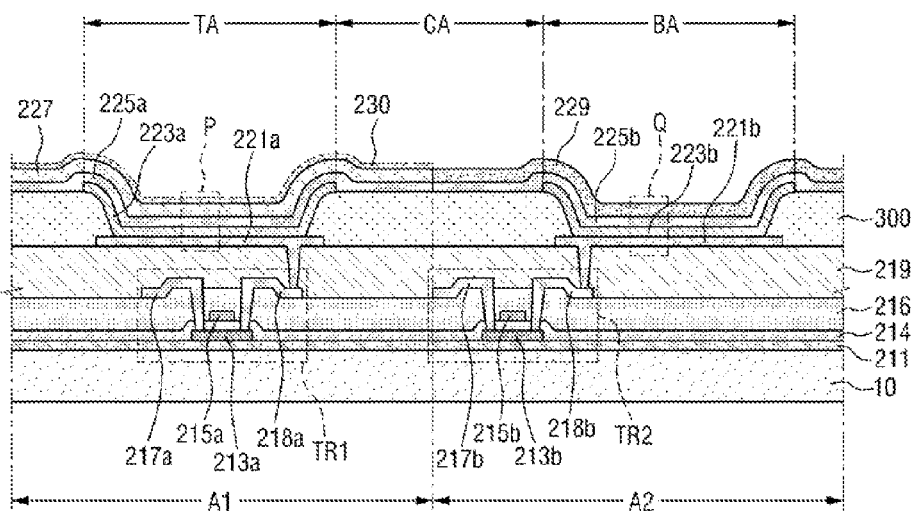

Thereafter, as illustrated in FIG. 10, the reflective material, e.g., Mg or Mg alloy, may be deposited on the auxiliary layer 227 and the second counter electrode 225b. The upper reflective layer 229 may be formed. An open mask may be used when depositing the reflective material, and the adhesive force between the material of the auxiliary layer 227 and the material of the upper reflective layer 227 may be smaller than the adhesive force between the material of the upper reflective layer 227 and the material of the second counter electrode 225b. For example, the material of the upper reflective layer 229 may be rarely deposited on the auxiliary layer 227 (e.g., may not remain or adhere on the auxiliary layer 227) and may be deposited only on (e.g., may remain on) the second counter electrode 225b. Thus, it is possible to obtain the patterning effect of the upper reflective layer 229 without using a separate fine metal mask.

Figure 11:
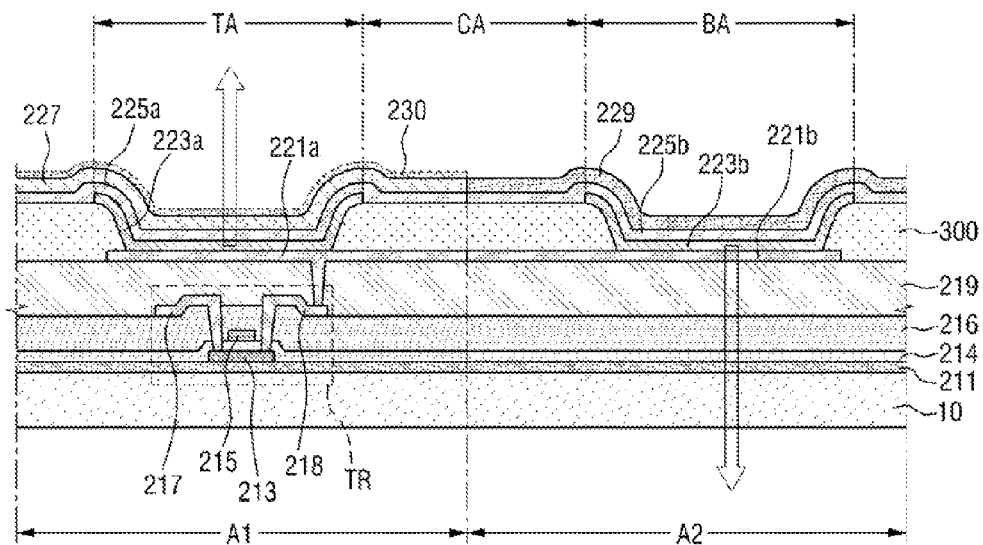
FIG. 11 illustrates a schematic cross-sectional view of a display device according to another embodiment.
Figure 12:
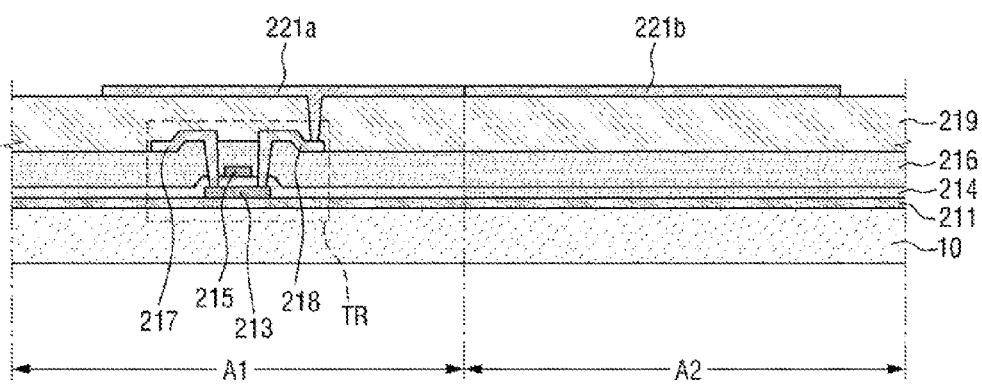
FIGS. 12 to 17 illustrate cross-sectional views of stages in a method for manufacturing the display apparatus illustrated in FIG. 11.

FIG. 11 illustrates a schematic cross-sectional view of a display device according to another embodiment. Referring to FIG. 11, in the display device according to the present embodiment, only the first pixel electrode 221a, the second pixel electrode 221b and the driving thin film transistor TR are different from those of the display device described in the description of FIGS. 2 to 4, and other configurations are substantially the same. Therefore, repeated description may be simplified or omitted, and the description may be made mainly on the differences.

The buffer layer 211 may be on the substrate 10 (that includes the first area A1 and the second area A2), and the semiconductor pattern 213 may be on the buffer layer 211. In an implementation, the semiconductor pattern 213 may be on the first area A1 of the substrate 10.

The gate insulating film 214 may be on the semiconductor pattern 213 and the buffer layer 211 to cover the semiconductor pattern 213, and the gate electrode 215 (overlying the semiconductor pattern 213 may be on the gate insulating film 214.

The interlayer insulating film 216, the source electrode 217, and the drain electrode 218 may be on the gate electrode 215. The source electrode 217 and the drain electrode 218 may be on the interlayer insulating film 216 and may be connected to the semiconductor pattern 213 through the interlayer insulating film 216 and the gate insulating film 214. As the source electrode 217 and the drain electrode 218 are formed on the interlayer insulating film 216, the driving thin film transistor TR may be provided on the substrate 10. The driving thin film transistor TR may include the semiconductor pattern 213, the gate insulating film 214, the gate electrode 215, the source electrode 217 and the drain electrode 217 as the switching elements of the display device.

The passivation layer 219 may be on the interlayer insulating film 216 to cover the source electrode 217 and the drain electrode 218, and the first pixel electrode 221a and the second pixel electrode 221b may be on the passivation layer 219.

The first pixel electrode 221a may be on the first area A1 of the substrate 10 on the top of the passivation layer 219, and the second pixel electrode 221b may be on the second area A2 of the substrate 10 on the top of the passivation layer 219. For example, the first pixel electrode 221a may be electrically connected to the drain electrode 218 through the passivation layer 219. In this example, the first pixel electrode 221a and the second pixel electrode 221b may be connected to each other. For example, the first pixel electrode and 221a and the second pixel electrode 221b may directly contact each other. In an implementation, as described in the description of FIGS. 2 to 4, when the first pixel electrode 221a and the second pixel electrode 221b are made up of a multi-layer structure, at least any one of the layers belonging to the first pixel electrode 221a may be extended to the upper side of the second area A2 of the substrate 10 on the top of the passivation layer 219 to form the second pixel electrode 221b.

The pixel defining film 300 may be on the passivation layer 219 to cover the edges of the first pixel electrode 221a and the second pixel electrode 221b, and the first organic layer 223a and the second organic layer 223b may be on the first pixel electrode 221a and the second pixel electrode 221b exposed by the pixel defining film 300, respectively. For example, the first counter electrode 225a and the second counter electrode 225b may be on the first organic layer 223a and the second organic layer 223b, respectively. The auxiliary layer 227 may be on the first counter electrode 225a and the upper reflective layer 229 may be on the second counter electrode 225b. In an implementation, the residual pattern 230 of the upper reflective layer may be on the auxiliary layer 227.

As described in the description of FIGS. 2 to 4, as the first counter electrode 225a is formed on the first organic layer 223a and the second counter electrode 225b is formed on the second organic layer 223b, the first organic light emitting element and the second organic light emitting element may be provided on a substrate 10 as the display elements of the display device. The first organic light emitting element may include the first pixel electrode 221a, the first organic layer 223a and the first counter electrode 225a, and the second organic light emitting element may include the second pixel electrode 221b, the second organic layer 223b and the second counter electrode 225b. In an implementation, the first pixel electrode 221a may have the light reflection characteristics and the first counter electrode 225a and the auxiliary layer 227 may have the light transmission characteristics, and light emitted from the first organic layer 223a may be provided to the first counter electrode 225a side or the upper side of the substrate 10. For example, the front light emitting area TA embodying an image to the upper side of the substrate 10 may be at or on the first area A1. In addition, the second pixel electrode 221b and the second counter electrode 225b may have the light transmission characteristics, the upper reflective layer 229 having the light reflection characteristics may be on the second counter electrode 225b, and the light emitted from the second organic film 223a may be provided to the lower side of the second pixel electrode 223b or the substrate 10. For example the rear light emitting area BA embodying an image to the downward direction side of the substrate 10 may be on or at the second area A2. In an implementation, a non-light emitting area CA (from which light is not emitted) may be between the front light emitting area TA and the rear light emitting area BA. For example, a part of the non-light emitting area CA and the front light emitting area TA may be on the first area A1, and another part of the non-light emitting area CA and the rear light emitting area BA may be on the second area A2. In an implementation, in an area of the non-light emitting area CA that does not overlap the upper reflective layer and 229, external light may be transmitted through the display device.

According to this example, the front light emitting area TA and the rear light emitting area BA may be formed on a single substrate 10. Also, the light emission of the front light emitting area TA and the light emission of the rear light emitting area BA may be controlled using a single driving thin film transistor, and it is possible to display the same image on both sides of the display device.

FIGS. 12 to 17 illustrate schematic cross-sectional views of stages in a method for manufacturing the display apparatus illustrated in FIG. 11.

Referring to FIGS. 12 to 17, first, the substrate 10 including the first area A1 and the second area A2 may be prepared. Next, the buffer layer 211 may be formed on the first area A1 and the second area A2 of the substrate 10, and the driving thin film transistor TR may be formed on the buffer layer 211 on the first area A1 of the substrate 10. Next, the passivation layer 219 may be formed on the substrate 10 to cover the driving thin film transistor TR, and the first pixel electrode 221a connected to the driving thin film transistor TR1 and the second pixel electrode 221b connected to the first pixel electrode 221a may be formed on the passivation layer 219. The first pixel electrode 221a may be connected to the driving thin film transistor TR through the passivation layer 219.

Figure 5:
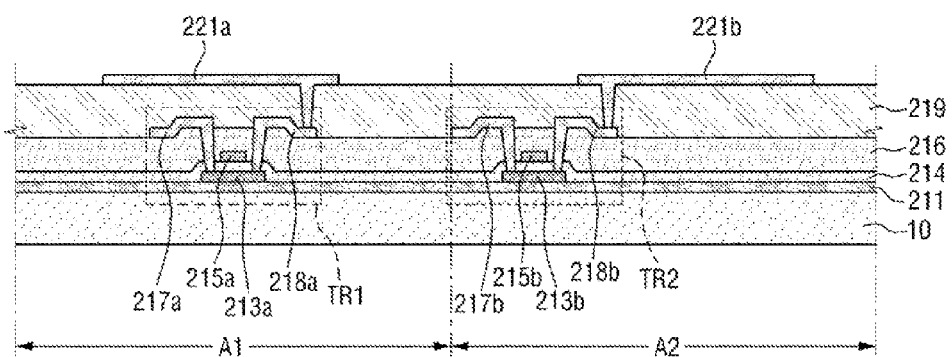
FIGS. 5 to 10 illustrate cross-sectional views of stages in a method for manufacturing the display device illustrated in FIG. 2.

A process of forming the driving thin film transistor TR may be substantially the same as that of the case of the first driving thin film transistor (TR1 of FIG. 5) described in FIG. 5, repeated detailed descriptions thereof may be omitted.

Figure 13:
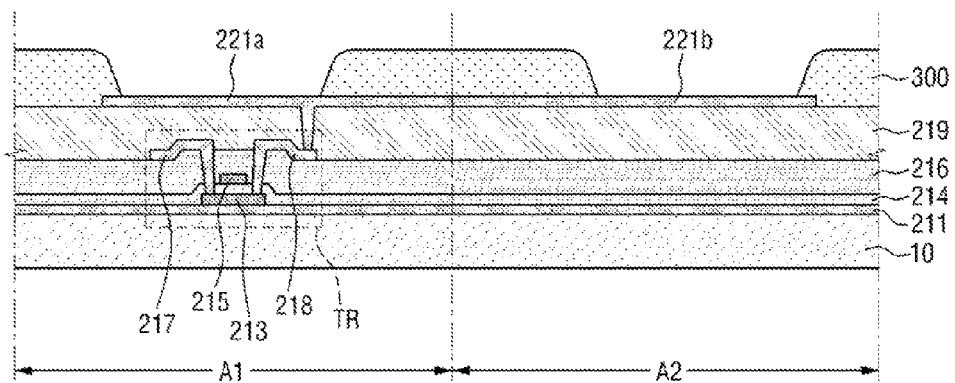
Figure 14:
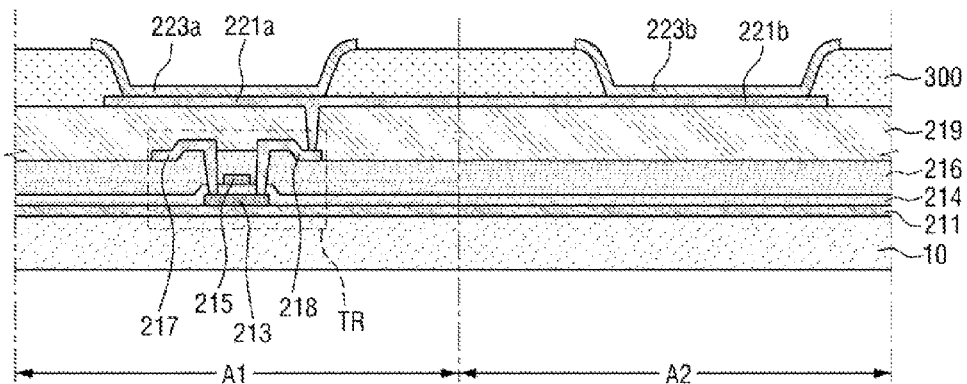

Thereafter, as illustrated in FIG. 13, the pixel defining film 300 may be formed on the passivation layer 219 to cover the edges of the first pixel electrode 221a and the second pixel electrode 221b. Then, as illustrated in FIG. 14, the first organic layer 223a may be formed on the first pixel electrode 221a, and the second organic layer 223b may be formed on the second pixel electrode 221b. The process of forming the first organic layer 223a and the process of forming the second organic layer 223b may be carried out within the same process.

Figure 15:
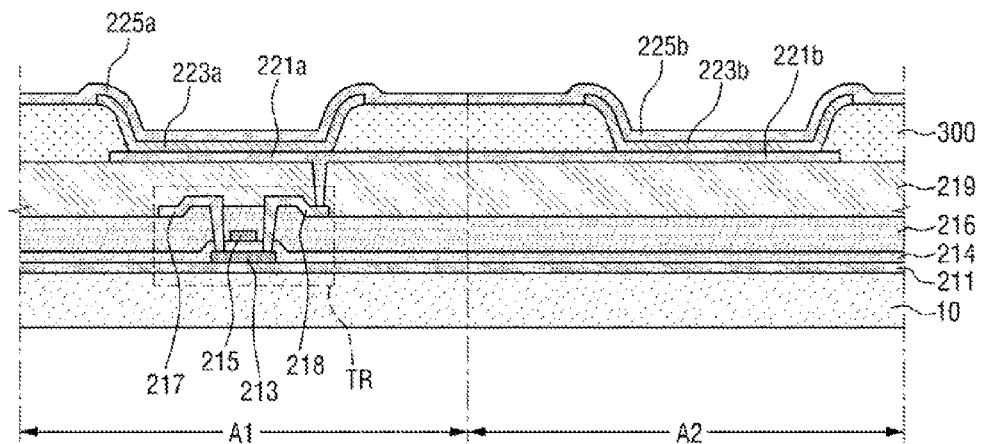

Then, as illustrated in FIG. 15, a metal or the like may be deposited on the first organic layer 223a, the second organic layer 223b and the pixel defining film 300 to form the first counter electrode 225a and the second counter electrode 225b.

Figure 16:
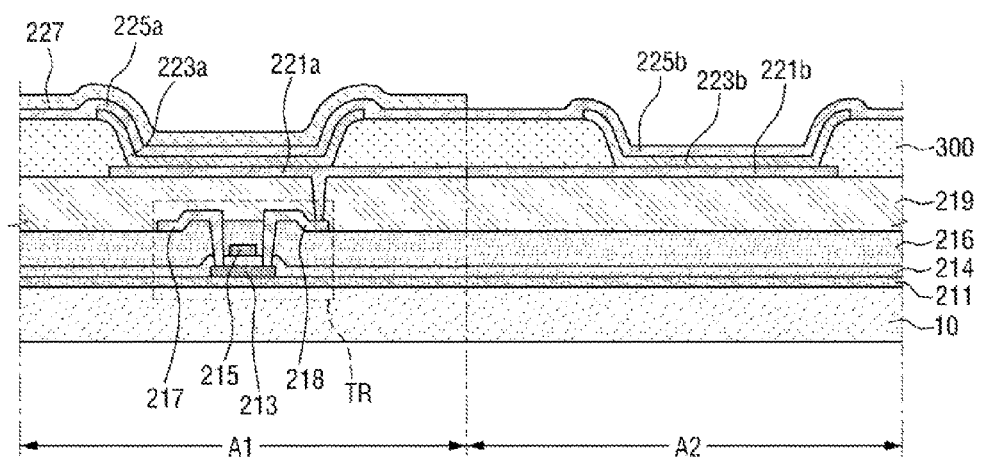
Figure 17:
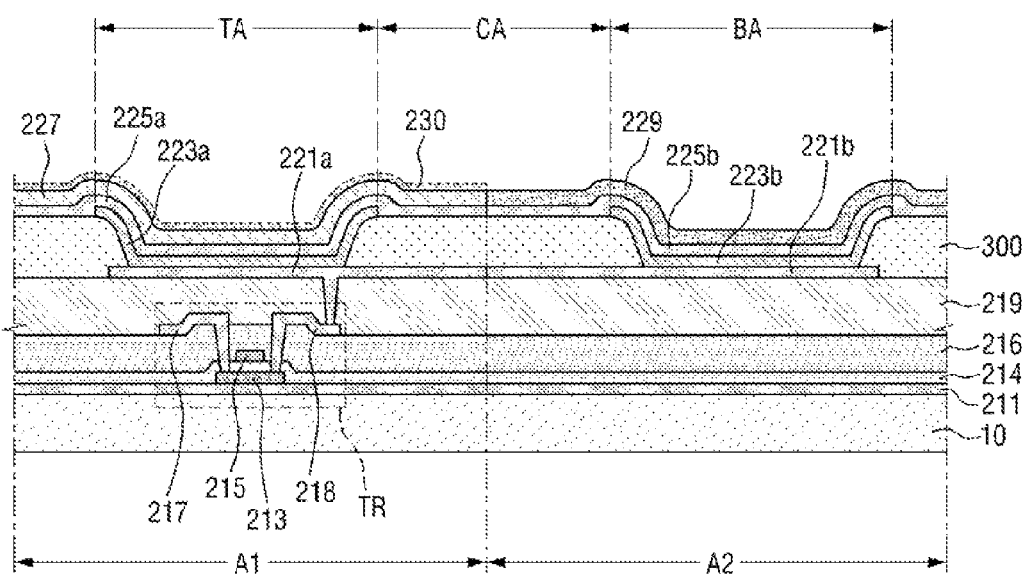

Thereafter, as illustrated in FIG. 16, the auxiliary layer 227 may be formed on the first counter electrode 225a, and as illustrated in FIG. 17, the reflective material, e.g., Mg or Mg alloy, may be deposited on the auxiliary layer 227 and the second counter electrode 225b to form the upper reflective layer 229. An open mask may be used when depositing the reflective material, and the adhesive force between the material of the auxiliary layer 227 and the material of the upper reflective layer 229 may be smaller than the adhesive force between the material of the upper reflective layer 229 and the material of the second counter electrode 225b. Thus, it is possible to obtain the patterning effect of the upper reflective layer 229, without using a separate fine metal mask.

By way of summation and review, both a front emission type light emitting device and a rear emission type light emitting device may be inside the double-sided emission organic light emitting display device, and a manufacturing process may be complicated.

The embodiments may provide a display device capable of being formed by a simplified manufacturing process.

The embodiments may provide a display device formed using an easily performed patterning process of metal or the like.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
a substrate that includes a first light emitting area and a second light emitting area;
a first pixel electrode on the first light emitting area of the substrate;
a second pixel electrode on the second light emitting area of the substrate;
a pixel defining film covering edges of the first pixel electrode and the second pixel electrode and including an aperture that exposes the first pixel electrode and the second pixel electrode;
a first organic layer on the first pixel electrode, the organic layer including a first light emitting layer;
a first counter electrode on the first organic layer;
an auxiliary layer on the first counter electrode at the first light emitting area of the substrate;
a second organic layer on the second pixel electrode, the second organic layer including a second light emitting layer;
a second counter electrode on the second organic layer;
an upper reflective layer on the second counter electrode at the second light emitting area of the substrate,
wherein the second light emitting layer fully overlaps the upper reflective layer within the aperture in plan view,
wherein the auxiliary layer includes a first portion overlapping the first light emitting layer and a second portion not overlapping the first light emitting layer,
wherein the first portion of the auxiliary layer is connected to the second portion of the auxiliary layer, and
wherein a side edge of the auxiliary layer is connected to a side edge of the upper reflective layer.

2. The display device as claimed in claim 1, wherein an adhesive force between a material of the upper reflective layer and a material of the second counter electrode is greater than an adhesive force between a material of the auxiliary layer and the material of the upper reflective layer.

3. The display device as claimed in claim 1, wherein:
the auxiliary layer includes an organic material, and
the upper reflective layer includes a metal.

4. The display device as claimed in claim 3, wherein:
the upper reflective layer includes magnesium, and
the organic material includes one of 8-quinolinolato lithium, N,N-diphenyl-N,N-bis(9-phenyl-9H-carbazole-3-yl)biphenyl-4,4'-diamine, N(diphenyl-4-yl)9,9-dimethyl-N-(4(9-phenyl-9H-carbazol-3-yl)phenyl)-9H-fluorene-2-amine, and 2-(4-(9, 10-di(naphthalene-2-yl)anthracene-2-yl)phenyl)-1-phenyl-1H-benzo-[D] imidazole.

5. The display device as claimed in claim 1, wherein:
the auxiliary layer directly contacts the first counter electrode, and the upper reflective layer directly contacts the second counter electrode.

6. The display device as claimed in claim 1, wherein the auxiliary layer overlies the first light emitting layer and does not overlie the second light emitting layer.

7. The display device as claimed in claim 1, wherein a thickness of the upper reflective layer is greater than a thickness of the first counter electrode and is greater than a thickness of the second counter electrode.

8. The display device as claimed in claim 1, wherein the first counter electrode and the second counter electrode are integrally formed.

9. The display device as claimed in claim 8, wherein the first counter electrode and the second counter electrode are formed of a same material.

10. The display device as claimed in claim 8, wherein the first counter electrode and the second counter electrode include at least one of aluminum, silver, and magnesium.

11. The display device as claimed in claim 1, wherein:
the first pixel electrode includes a first lower transparent conductive layer on the substrate, a first metal layer on the first lower transparent conductive layer, and a first upper transparent conductive layer on the first metal layer,
the second pixel electrode includes a second lower transparent conductive layer on the substrate, a second metal layer on the second lower transparent conductive layer, and a second upper transparent conductive layer on the second metal layer, and
a thickness of the first metal layer is greater than a thickness of the second metal layer.

12. The display device as claimed in claim 11, wherein the first metal layer and the second metal layer are formed of a same material.

13. The display device as claimed in claim 1, further comprising:
a first driving thin film transistor on the substrate, the first driving thin film transistor being electrically connected to the first pixel electrode; and
a second driving thin film transistor on the substrate, second first driving thin film transistor being electrically connected to the second pixel electrode,
wherein the first pixel electrode and the second pixel electrode are spaced apart from each other.

14. The display device as claimed in claim 13, wherein the first driving thin film transistor underlies the first pixel electrode.

15. The display device as claimed in claim 13, wherein the second driving thin film transistor does not underlie the second light emitting layer.

16. The display device as claimed in claim 13, wherein the second driving thin film transistor underlies the upper reflective layer.

17. The display device as claimed in claim 1, further comprising a driving thin film transistor on the substrate, the driving thin film transistor being electrically connected to first pixel electrode,
wherein the driving thin film transistor underlies the first pixel electrode.

18. The display device as claimed in claim 17, wherein the first pixel electrode is connected to the second pixel electrode.

19. A method for manufacturing a display device, the method comprising:
preparing a substrate such that the substrate includes a first light emitting area and a second light emitting area;
forming a first pixel electrode on the first light emitting area of the substrate,
forming a second pixel electrode on the second light emitting area of the substrate;
forming a pixel defining film which covers edges of the first pixel electrode and the second pixel electrode and includes an aperture that exposes the first pixel electrode and the second pixel electrode;
forming a first organic layer on the first pixel electrode such that the first organic layer includes a first light emitting layer, forming a second organic layer on the second pixel electrode such that the second organic layer includes a second light emitting layer;
depositing a conductive material on the first organic layer and the second organic layer to form a first counter electrode on the first organic layer and a second counter electrode located on the second organic layer;
forming an auxiliary layer on the first counter electrode such that the auxiliary layer overlies the first light emitting layer and does not overlie the second light emitting layer; and
depositing a metal on the first light emitting area of the substrate and the second light emitting area of the substrate to form an upper reflective layer on the second counter electrode,
wherein the second light emitting layer fully overlaps the upper reflective layer within the aperture in plan view,
wherein the auxiliary layer includes a first portion overlapping the first light emitting layer and a second portion not overlapping the first light emitting layer,
wherein the first portion of the auxiliary layer is connected to the second portion of the auxiliary layer, and
wherein a side edge of the auxiliary layer is connected to a side edge of the upper reflective layer.

20. The method as claimed in claim 19, wherein:
the auxiliary layer includes an organic material, and
the upper reflective layer includes a metal.

21. A display device, comprising:
a substrate that includes a first light emitting area and a second light emitting area;
a first pixel electrode on the first light emitting area of the substrate;
a second pixel electrode on the second light emitting area of the substrate;
a pixel defining film covering edges of the first pixel electrode and the second pixel electrode and including an aperture that exposes the first pixel electrode and the second pixel electrode, and
a first organic layer on the first pixel electrode, the organic layer including a first light emitting layer;
a first counter electrode on the first organic layer;
an auxiliary layer on the first counter electrode at the first light emitting area of the substrate;
a second organic layer on the second pixel electrode, the second organic layer including a second light emitting layer;
a second counter electrode on the second organic layer;
an upper reflective layer on the second counter electrode at the second light emitting area of the substrate,
wherein the second light emitting layer overlaps the upper reflective layer within the aperture in plan view,
wherein a width of the auxiliary layer is wider than a width of the first light emitting layer, and
wherein a side edge of the auxiliary layer is connected to a side edge of the upper reflective layer.

* * * * *